United States Patent
Loboda

(10) Patent No.: US 8,343,854 B2
(45) Date of Patent: Jan. 1, 2013

(54) METHOD OF REDUCING MEMORY EFFECTS IN SEMICONDUCTOR EPITAXY

(75) Inventor: Mark Loboda, Bay City, MI (US)

(73) Assignee: Dow Corning Corporation, Midland, MI (US)

( * ) Notice: Subject to any disclaimer, the term of this patent is extended or adjusted under 35 U.S.C. 154(b) by 123 days.

(21) Appl. No.: 12/993,938

(22) PCT Filed: May 29, 2009

(86) PCT No.: PCT/US2009/045551
§ 371 (c)(1),
(2), (4) Date: Nov. 22, 2010

(87) PCT Pub. No.: WO2009/148930
PCT Pub. Date: Dec. 10, 2009

(65) Prior Publication Data
US 2011/0073874 A1    Mar. 31, 2011

Related U.S. Application Data

(60) Provisional application No. 61/058,660, filed on Jun. 4, 2008.

(51) Int. Cl.
*H01L 21/20* (2006.01)
*H01L 21/36* (2006.01)

(52) U.S. Cl. .............................. 438/478; 257/77; 117/88

(58) Field of Classification Search .................. 438/478; 257/77, E29.068; 117/88
See application file for complete search history.

(56) References Cited

U.S. PATENT DOCUMENTS

| 5,248,385 | A |   | 9/1993 | Powell |
|---|---|---|---|---|
| 5,964,943 | A | * | 10/1999 | Stein et al. ........................ 117/88 |
| 6,277,194 | B1 |   | 8/2001 | Thilderkvist et al. |
| 6,777,747 | B2 |   | 8/2004 | Yedinak et al. |
| 7,064,073 | B1 |   | 6/2006 | U'ren |
| 7,368,368 | B2 |   | 5/2008 | Emerson |
| 7,435,665 | B2 | * | 10/2008 | Airaksinen et al. ........... 438/478 |
| 7,651,948 | B2 |   | 1/2010 | Kim et al. |
| 7,732,305 | B2 | * | 6/2010 | Ye et al. ......................... 438/478 |

FOREIGN PATENT DOCUMENTS

EP    1 094 129    4/2001

OTHER PUBLICATIONS

N. Nordell, A. Schoner, M.K. Linnarsson: "Control of Al and B Doping Transients in 6H and 4H SiC Grown by Vapor Phase Epitaxy," Journal of Electronic Materials, vol. 26, No. 3, 1997 (6 pages).
Written Opinion of the International Searching Authority corresponding to International Patent Application No. PCT/US2009/045551, dated Sep. 1, 2009 (6 pages).
International Search Report corresponding to International Patent Application No. PCT/US2009/045551, dated Sep. 1, 2009 (3 pages).
Bernard Thomas: "Advances in 4H-SiC Homoepitaxy for Production and Development of Power Devices," Mater. Res. Soc. Symp. Proc. vol. 911, 2006 (14 pages).

* cited by examiner

*Primary Examiner* — Phuc Dang
(74) *Attorney, Agent, or Firm* — Nixon Peabody LLP

(57) ABSTRACT

A method of reducing memory effects during an epitaxial growth process is provided in which a gas mixture comprising hydrogen gas and a halogen-containing gas is used to flush the CVD reaction chamber between growth steps.

12 Claims, 3 Drawing Sheets

Aluminum concentration in a 2 um thick p+ SiC epilayer (Run 137) determined by SIMS Aluminum concentration in a 2 um thick p+ SiC epilayer (Run 137) determined by SIMS Aluminum concentration in an n- drift layer (run 138) determined by SIMS Nitrogen concentration in an n- drift layer (run 138) determined by SIMS

METHOD OF REDUCING MEMORY EFFECTS IN SEMICONDUCTOR EPITAXY

CROSS-REFERENCE TO RELATED APPLICATION

This application is a nationalization of PCT/US2009/045551 filed on May 29, 2009, which claims benefit to U.S. Provisional Application No. 61/058,660, filed on Jun. 4, 2008.

The present invention is directed to a method of reducing memory effects during epitaxial growth of semiconductor materials, and more particularly, to a chemical vapor deposition method which utilizes a gas mixture to purge the reaction chamber between epitaxial growth reactions and provide improved reproducibility in the electrical properties of the semiconductor.

Epitaxy is commonly used in the semiconductor industry, and particularly in the manufacture of silicon-based semiconductor materials. In CVD epitaxy, a chemical vapor deposition (CVD) process is typically employed which includes the transport of precursor gases to a growth or reaction chamber which contains a substrate (which substrate has been chosen to define the crystal structure of the resulting CVD film), deposition/adsorption of reactants on substrate surface, and desorption of by-products which are transported to an exhaust. In addition, the epitaxial layer can be doped with impurities during the growth process in order to control the electrical properties of the layer. Silicon carbide (SiC) semiconductor devices may be configured from successive layers of n- and p-doped SiC grown epitaxially on an SiC substrate. Dopant types and concentrations are often indicated by the letters "n" or "p", referring to impurities which generate electrons or holes, respectively, and followed by a "+" or a "−", which refer to high and low dopant concentrations, respectively. High concentrations typically range from $5 \times 10^{17}$ cm$^{-3}$ to $1 \times 10^{20}$ cm$^{-3}$ while low concentrations range from $5 \times 10^{13}$ cm$^{-3}$ to $5 \times 10^{17}$ cm$^{-3}$. Typical dopants used in the SiC, Si or SiGe CVD processes include boron (precursor gases $B_2H_6$ or $BCl_3$), phosphorus (precursor gases $PH_3$ or $(CH_3)_3P$), and aluminum (precursor gases $(CH_3)_3Al$ and arsenic ($AsH_3$).

Typical gaseous precursors for SiC CVD processes include silanes ($R_xSiH_{(4-x)}$ or $R_xSiCl_{(4-x)}$ where R can be H or hydrocarbon) and hydrocarbons ($CH_4$, $C_3H_8$). Typical gaseous precursors for silicon CVD processes are silanes ($H_xSiH_{(4-x)}$ or $H_xSiCl_{(4-x)}$).

Typical dopant gases used in GaAs CVD processes are silanes ($H_xSiH_{(4-x)}$ or $H_xSiCl_{(4-x)}$), organo-zinc compounds, or carbon containing gases ($CH_4$, $CCl_4$), and typical gaseous precursors are trimethyl gallium and arsine.

Typical dopant gases used in GaN CVD processes are silanes ($H_xSiH_{(4-x)}$ or $H_xSiCl_{(4-x)}$), organo-magnesium compounds, or carbon containing gases ($CH_4$, $CCl_4$) and typical gaseous precursors are trimethyl gallium, nitrogen, and/or ammonia.

However, during the growth reaction, partially reacted precursors and/or dopant gases can become temporarily trapped within low flow zones or in porous materials in the reaction chamber. In addition, ancillary deposits may form on the reaction cell walls containing the dopant. The latent release and/or vaporization of the partially-reacted precursors and ancillary deposits can result in irreproducibility of the electrical properties of the epitaxial layer. This phenomenon is commonly referred to as "memory effects." For example, when trimethylaluminum (TMAI) dopant is used to grow p-type silicon carbide, it can diffuse into the graphite materials comprising the reaction zone of the CVD vacuum chamber. SiC containing aluminum is also formed on the walls of the reaction cell. Cycling of the process in the reaction chamber over time evaporates the deposits and draws the "trapped" aluminum dopant back into the reaction zone where it is then incorporated into the newly formed epitaxy layer. This is undesirable where the newly doped film is an n-type film, as the residual p-type impurities from the ancillary SiC deposits will also dope the SiC, effectively cancelling the electrical effect of the n-type dopant, i.e., the chamber has "remembered" the preceding p-type growth process.

As it is hard to predict the memory effect phenomena and the amount of TMAI dopant going back into the process, the effect leads to irreproducibility of the doping concentration in the epitaxy layer.

While mechanical cleaning or replacement of contaminated CVD susceptor parts is a possible solution, it is costly and not practical for a continuous multi-layer growth such as a p+/p− structure.

Other attempts have been made to minimize memory effects in SiC epitaxy. For example, after a p-type SiC epitaxial growth step, the chamber may be coated with low concentration n-type SiC. See Bernd Thomas et al., "Advances in 4H-SiC Homoepitaxy for Production and Development of Power Devices," *Mater. Res. Soc. Symp. Proc.* Vol. 911, 2006. This process forms a film coating on the areas of the reaction zone covered/impregnated with ancillary p-type SiC and prevents the transport of the p-type impurities in a subsequent epitaxy process. However, while this method reduces memory effects, it is inefficient and costly as it may lead to premature degradation of the reaction zone components and the early formation of excessive particulate contamination.

Accordingly, there is a need in the art for a method of reducing the memory effects which occur during epitaxial growth of semiconductor materials which allows the successful epitaxial CVD growth of semiconductor device structures with good reproducibility of electrical properties.

Embodiments of the present invention meet that need by providing a method of reducing or eliminating the memory effect which can occur during epitaxial growth by flushing the CVD reaction chamber between epitaxial growth reactions using a gas mixture comprising hydrogen and a halogen-containing gas. This method effectively eliminates residual dopant sources from the reaction chamber. The method has been used to successfully grow silicon-based structures such as n+ SiC/n− SiC/p+ SiC epitaxy structures with good reproducibility. The method may also be used to improve reproducibility in epitaxial growth of semiconductor materials including SiC, GaN, GaAs, and SiGe.

According to one aspect of the present invention, a method of reducing memory effects during epitaxial growth of semiconductor materials is provided which includes providing a reaction chamber; providing a semiconductor substrate, providing a precursor gas or gases; performing an epitaxial CVD growth of a doped semiconductor material on the substrate in the reaction chamber to form a first layer; flushing the reaction chamber with a gas mixture comprising hydrogen and a halogen-containing gas, and performing an epitaxial CVD growth of a second doped semiconductor material on the substrate in the reaction chamber to form a second layer.

The semiconductor substrate may remain in the chamber during the flushing process, or it may be removed prior to the flushing process. Alternatively, the semiconductor substrate (with the first layer thereon) may be removed prior to the flushing process, and a new semiconductor substrate may be provided after the flushing process for epitaxial growth of the second layer.

The reaction chamber is flushed at a temperature between about 450° C. to 1800° C., more preferably, at a temperature between about 1000° C. to 1600° C. or greater, and most preferably, at a temperature between about 1300° C. to 1600° C.

The halogen-containing gas may be selected from HCl, $Cl_2$, $F_2$, $CF_4$, $ClF_3$, and HBr.

In another embodiment of the invention, the method comprises providing a reaction chamber; providing a semiconductor substrate, providing a precursor gas or gases; performing an epitaxial CVD growth of an n-doped SiC layer, performing an epitaxial CVD growth of a p-doped SiC layer; removing the substrate with the layers thereon, flushing the chamber with a gas mixture comprising hydrogen and a halogen-containing gas, placing the substrate with the layers thereon back into the chamber; providing a precursor gas or gases; performing an epitaxial CVD growth of an n-doped SiC layer doped semiconductor material in the reaction chamber, and performing an epitaxial CVD growth of a p-doped SiC layer doped semiconductor material in the reaction chamber.

In another embodiment of the invention, the method comprises providing a reaction chamber; providing a semiconductor substrate, providing a precursor gas or gases; performing an epitaxial CVD growth of a first p-doped SiC layer in the reaction chamber; flushing the reaction chamber with a gas mixture comprising hydrogen and a halogen-containing gas, and performing epitaxial CVD growth of a second p-doped SiC layer having a lower dopant concentration than the first p-doped SiC layer.

The methods described above may be applied to structures of SiC, GaAs, GaN, or SiGe comprising two or more epitaxial layers. The method may also be applied to structures where the substrate and the epitaxial layers comprise essentially the same material (homoepitaxy) or different materials (heteroepitaxy).

In embodiments where a SiC substrate structure is formed by the method, a SiC semiconductor device may be formed on the substrate containing the CVD grown epitaxial layers.

Accordingly, it is a feature of the present invention to provide a method of reducing memory effects during epitaxial growth of semiconductor materials. These, and other features and advantages of the present invention, will become apparent from the following detailed description, the accompanying drawings, and the appended claims.

Figure 1:
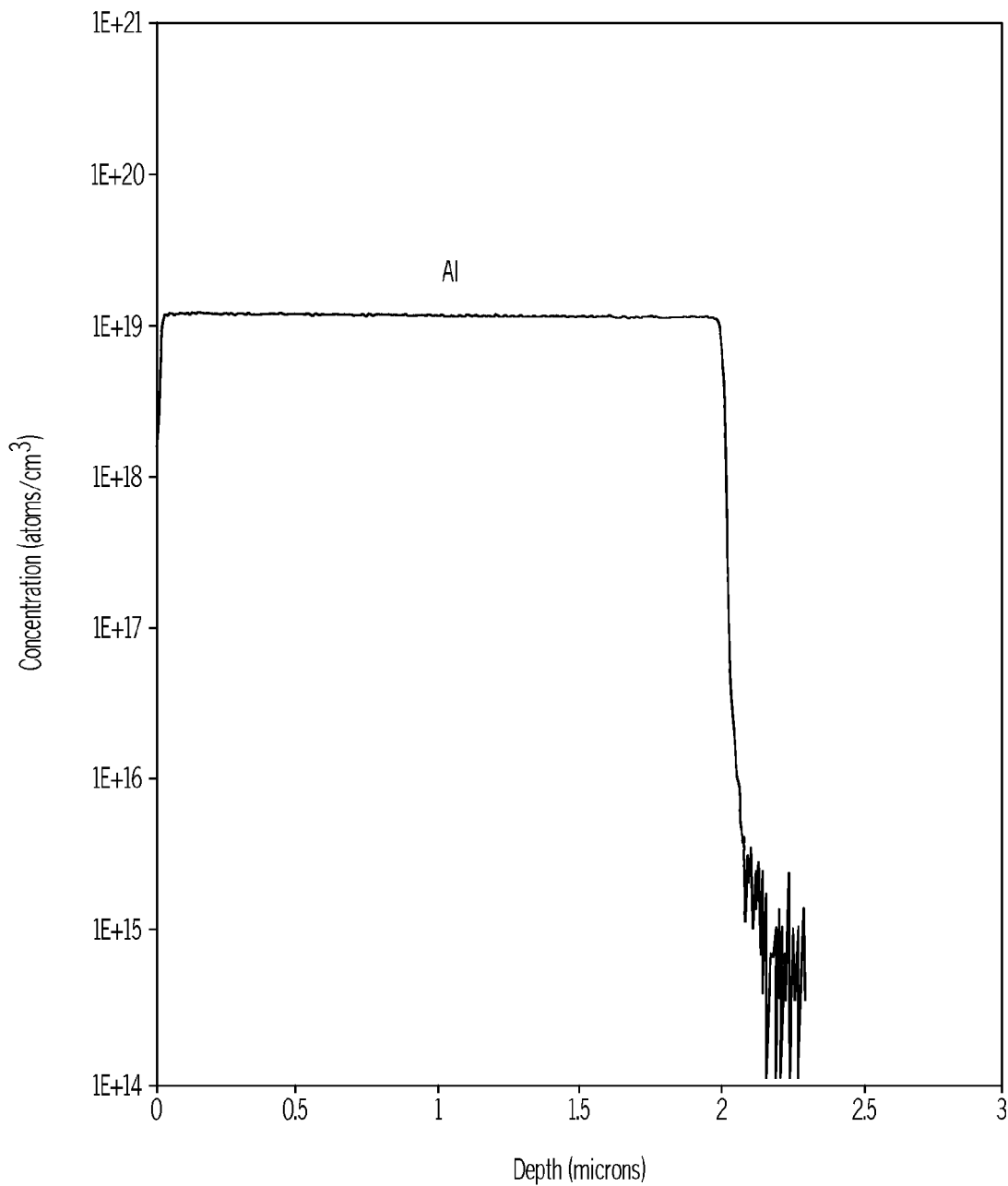
FIG. 1 is a graph illustrating the concentration of aluminum in a p+ SiC epitaxial CVD layer formed in accordance with an embodiment of the present invention.

Embodiments of the method of the present invention provide several advantages over prior methods of epitaxial growth. We have unexpectedly found that the undesired doping from residual p-type impurities in SiC can be suppressed to allow repeatable successive growth of p-n structures by incorporation of a high temperature gas flush between epitaxial growth processes. It has also been unexpectedly found that the memory effect is eliminated without significant removal of ancillary deposits from the reaction zone.

In a preferred embodiment of the present invention for CVD SiC epitaxy, the temperature in the chemical vapor deposition reaction chamber is maintained at a temperature of between about 1550 to 1650° C. and a pressure of about 100 to 150 mbar. Suitable silicon source gases for use in the method include dichlorosilane and trichlorosilane. A carbon source gas may comprise propane. The carrier gas may comprise hydrogen. The n-dopant gas may comprise nitrogen, and the p-dopant gas may comprise trimethylaluminum.

In one embodiment of the method of the present invention, after formation of a p-doped epitaxial layer, the reaction chamber is flushed with a mixture of hydrogen and a halogen containing gas. The halogen-containing gas may comprise HCl, $Cl_2$, $F_2$, $CF_4$, $ClF_3$, or HBr and is preferably used in a concentration of between about 0.001% and 50%, more preferably, between about 0.05% to 20%, and most preferably, between about 0.1% and 10%. However, it should be appreciated that the amount of halogen-containing gas may vary according to the size and surface area of the reaction chamber. In a preferred embodiment, the mixture comprises about 60 slm $H_2$ and 100 sccm HCl.

By "flushing," it is meant that the gas mixture is run through the chamber in the absence of a main precursor species, i.e., a depositing species is not included. After flushing, another n-doped epitaxial layer or p-doped epitaxial layer may then be grown. The target dopant concentration of any of the n-type or p-type layers is preferably between about $5 \times 10^{13}$ $cm^{-3}$ and $1 \times 10^{19}$ $cm^{-3}$.

In another embodiment of the method, a first p-doped epitaxial layer is grown followed by flushing with the hydrogen/halogen-containing gas mixture, and then a second p-doped epitaxial layer is grown, where the dopant concentration of the second p-doped layer is lower than the first layer. In this embodiment, the dopant concentration of the first p-doped layer is between about $1 \times 10^{16}$ $cm^{-3}$ and $1 \times 10^{19}$ $cm^{-3}$ and the dopant concentration of the second p-doped layer is between about $5 \times 10^{13}$ and $1 \times 10^{17}$ $cm^{-3}$. Use of the hydrogen/halogen-containing flushing gas mixture effectively removes residual impurities from the prior epitaxial growth process in the reaction chamber and significantly reduces memory effect. Doping concentrations of the successive n and p layers or successive p+/p− layers are repeatable as long as the CVD reaction chamber is flushed between each successive epitaxial process. The method may be used to grow a variety of multi-layer SiC device structures such as PiN diodes, MESFETS, bipolar junction transistors, and the like.

It should be appreciated that in situations where SiC epitaxy structures require a growth sequence where the dopant carrier type is changed, i.e., p-n, or where a third layer, e.g., n-p-n, is desired, the flush may be performed following each growth process. It is noted that the flushing step may result in etching a portion of the previously grown layer in instances where the substrate remains in the chamber during the flushing process. Accordingly, in order to obtain the desired p-layer thickness, the layer should initially be grown to a thickness which includes an additional margin of thickness which can be etched off during the flush so that the desired end thickness is achieved. This same technique may be employed to grow a plurality of p-type layers where each successive layer has a lower dopant concentration.

In order that the invention may be more readily understood, reference is made to the following examples which are intended to illustrate the invention, but not limit the scope thereof.

EXAMPLE 1

An SiC epitaxial growth process was performed under the following process conditions in a multi-wafer planetary motion inductively heated CVD reaction chamber.

| | |
|---|---|
| Temperature | 1550 to 1650° C. |
| Pressure | 100 to 150 mbar |
| Silicon source gas | dichlorosilane or trichlorosilane |
| carbon source gas | propane |
| carrier gas | hydrogen |
| n-dopant gas | $N_2$ |
| p-dopant gas | trimethylaluminum |

Immediately following a SiC CVD epitaxy growth of a thin film structure comprising n+(layer 1)n−(layer 2)/p+(layer 3), the substrates were removed from the reaction chamber, the chamber was flushed with a mixture of 100 sccm HCl gas and 60 slm $H_2$. The HCl/$H_2$ mixture was introduced into the SiC epitaxy reactor at a pressure of 500 mbar and a temperature of 1600° C. for 4 hours. Following the flush procedure, new substrates were loaded into the chamber and SiC CVD epitaxy processes for low doped n-type SiC were performed. The results are shown in Table 1 below.

TABLE 1

| Run ID | Growth Type | C/Si ratio | $N_2$ flow (sccm) | TMAl flow (sccm) | Doping ($cm^3$) |
|---|---|---|---|---|---|
| 134 | n− | 1.65 | 0.05 | 0 | $1.85 \times 10^{15}$ |
| 135 | n− | 1.65 | 0.05 | 0 | $1.72 \times 10^{15}$ |
| 136 | n− | 1.65 | 0.05 | 0 | $1.65 \times 10^{15}$ |
| 137 | p+ | 1.75 | 0 | 100 | $1.20 \times 10^{19}$ |
| HCl/$H_2$ flush | | | | | |
| 138 | n− | 1.65 | 0.05 | 0 | $2.10 \times 10^{15}$ |
| 139 | p+ | 1.75 | 0 | 10 | $8.9 \times 10^{17}$ |
| HCl/$H_2$ flush | | | | | |
| 140 | n− | 1.65 | 0.05 | 0 | $1.86 \times 10^{15}$ |
| 141 | p+ | 1 | 0 | 10 | $6.22 \times 10^{16}$ |
| HCl/$H_2$ flush | | | | | |
| 142 | n− | 1.65 | 0.05 | 0 | $8.28 \times 10^{14}$ |

The results show that a baseline n-type doping level was established by three consecutive n-doped layer growth runs (134-136) and yielded consistently low net doping of about $2 \times 10^{15}$ $cm^{-3}$ n-type as determined by mercury probe C-V measurement. A p+ layer growth (run 137) was then performed followed by a 4-hour HCl/$H_2$ flush. Next, an n-doped layer was grown under similar conditions, and a net doping concentration of $2.1 \times 10^{15}$ $cm^{-3}$ n-type was obtained. This indicates that residual aluminum was removed from the reaction chamber and a clean background was achieved with the HCl/$H_2$ flush. Following run 138, the cycle was repeated two more times in succession. The repeatability of the n-dopant concentration in the layer is indicated in Table 1. As can be seen, the control of the net doping in the n-type layer was maintained within a factor of two.

Figure 2:
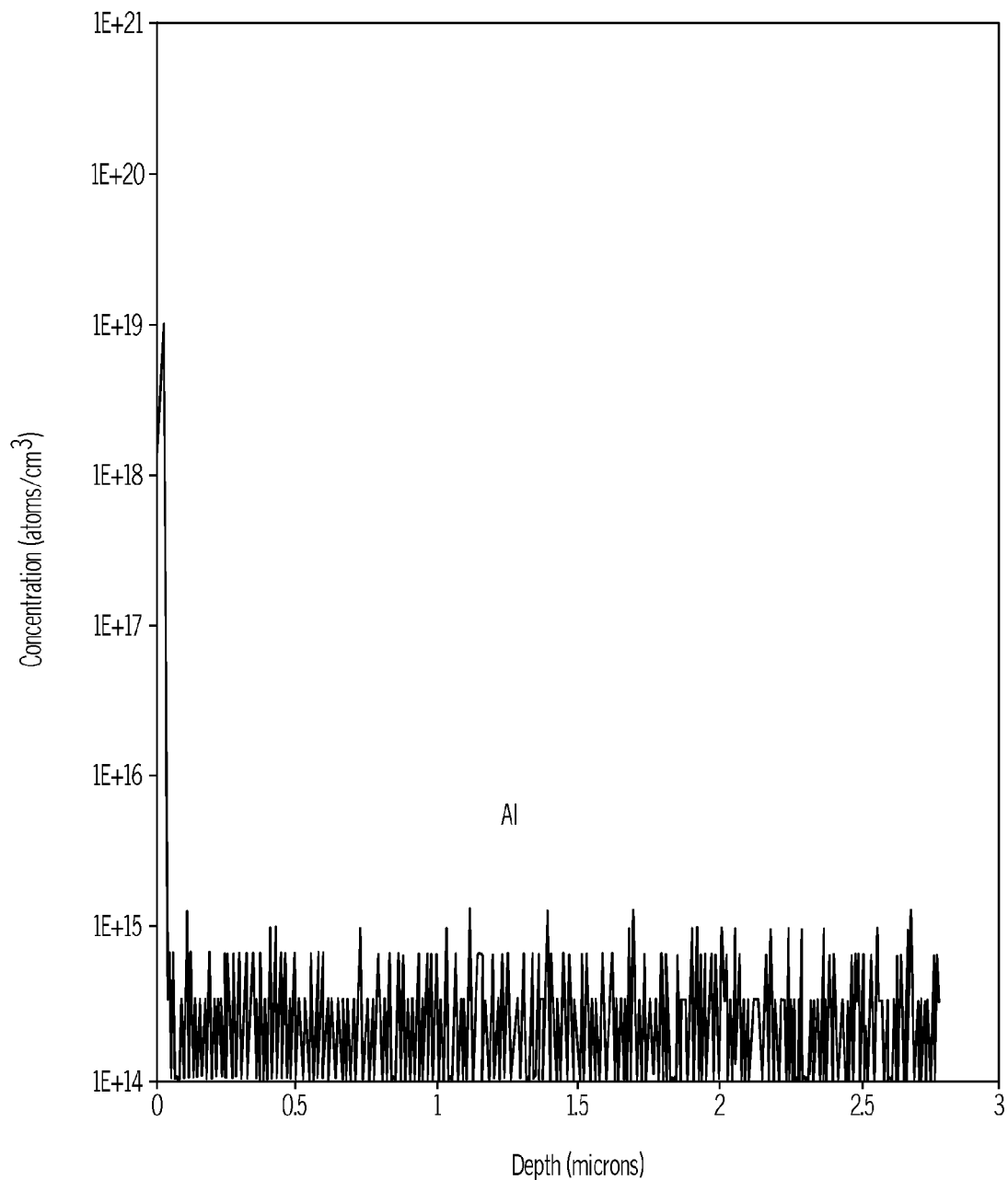
FIG. 2 is a graph illustrating aluminum concentration in an n− SiC epitaxial CVD formed layer.
Figure 3:
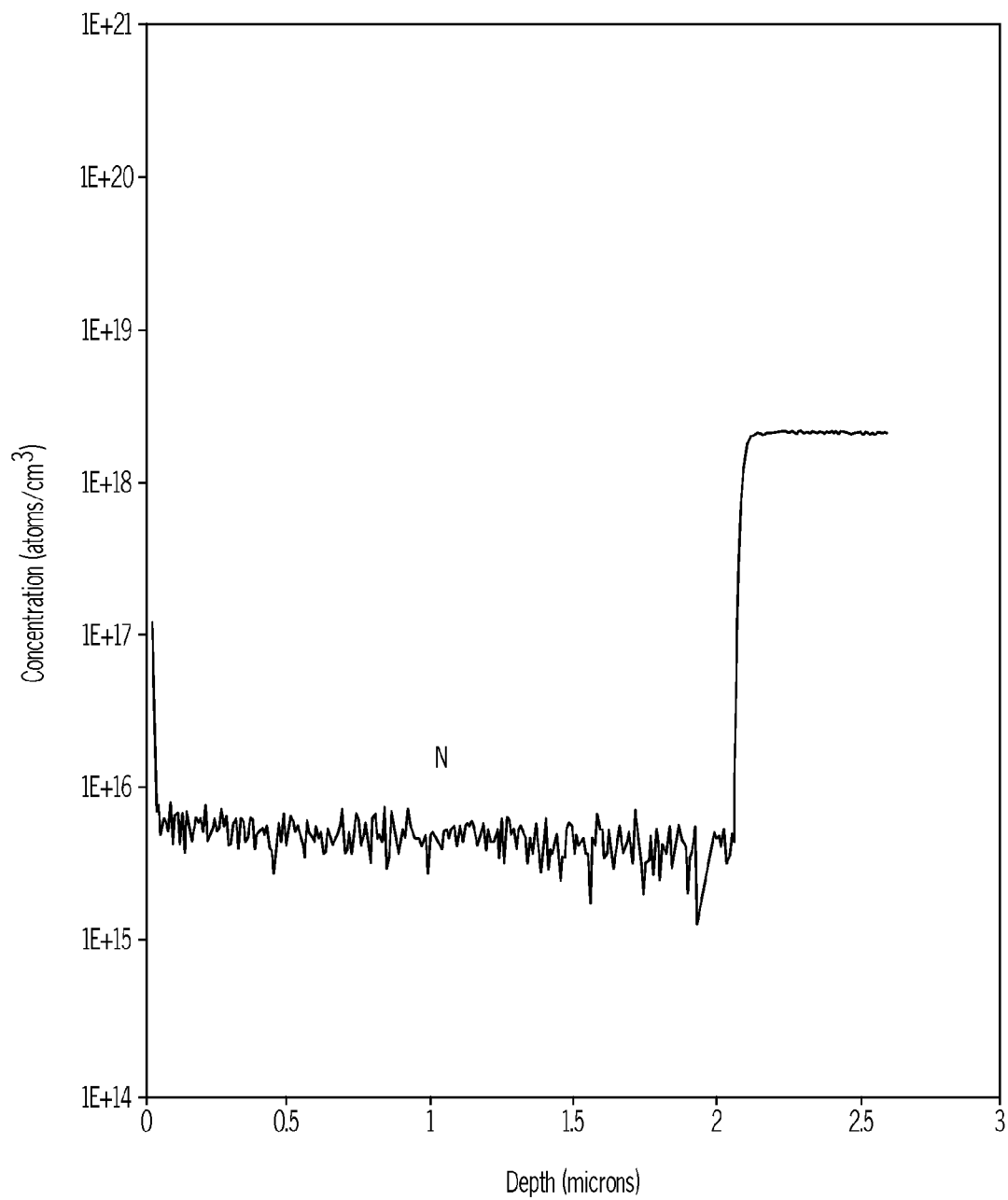
FIG. 3 is a graph illustrating nitrogen concentration in an n− SiC epitaxial CVD formed layer.

Sample 137 was analyzed by SIMS (Secondary Iron Mass Spectrometry), and an aluminum concentration over $1 \times 10^{19}$ $cm^{-3}$ was detected as shown in FIG. 1. Sample 138 was also analyzed by SIMS and it was found that both nitrogen and aluminum were below their detection limits ($2 \times 10^{15} cm^{-3}$ and $5 \times 10^{13} cm^{-3}$, respectively) as shown in FIGS. 2 and 3.

It can be concluded that the $H_2$/HCl flush step after p+ SiC epilayer growth effectively removed residual aluminum sources from the reactor chamber and greatly reduced doping memory effect.

Having described the invention in detail and by reference to preferred embodiments thereof, it will be apparent that modifications and variations are possible without departing from the scope of the invention.

The invention claimed is:

1. A method of reducing memory effects during epitaxial growth of semiconductor materials comprising:
   providing a reaction chamber;
   providing a semiconductor substrate;
   providing a precursor gas or gases;
   performing an epitaxial CVD growth of a doped semiconductor material on said substrate in said reaction chamber to form a first layer;
   flushing said reaction chamber with a gas mixture comprising hydrogen and a halogen-containing gas; and
   performing an epitaxial CVD growth of a doped semiconductor material on said substrate in said reaction chamber to form a second layer.

2. The method of claim 1 wherein said reaction chamber is flushed at a temperature of between about 450° C. to 1800° C.

3. The method of claim 1 wherein said reaction chamber is flushed at a temperature of between about 1300° C. to 1600° C.

4. The method of claim 1 wherein said semiconductor material is selected from SiC, GaN, GaAs, and SiGe.

5. The method of claim 1 wherein said halogen-containing gas is selected from HCl, $Cl_2$, $F_2$, $CF_4$, $ClF_3$, and HBr.

6. The method of claim 1 wherein said semiconductor substrate remains in said chamber during said flushing process.

7. The method of claim 1 wherein said semiconductor substrate is removed from said chamber prior to said flushing process and is replaced after said flushing process.

8. The method of claim 1 wherein said semiconductor substrate is removed from said chamber prior to said flushing process and replaced with a new semiconductor substrate after said flushing process.

9. The method of claim 1 wherein said first layer of doped semiconductor material comprises n-doped SiC and said second layer of doped semiconductor material comprises p-doped SiC.

10. The method of claim 1 wherein said first layer of doped semiconductor material comprises p-doped SiC and said second layer of doped semiconductor material comprises p-doped SiC having a lower dopant concentration than said first layer.

11. The method of claim 1 wherein the concentration of said halogen-containing gas is between about 0.1 and 10%.

12. A silicon carbide semiconductor device formed on the structure made by the method of claim 1.

\* \* \* \* \*